US009666962B1

(12) United States Patent
Bucher

(10) Patent No.: US 9,666,962 B1
(45) Date of Patent: May 30, 2017

(54) POWER TERMINAL WITH COMPLIANT PIN FOR ELECTRICAL POWER CONNECTOR

(71) Applicant: TYCO ELECTRONICS CORPORATION, Berwyn, PA (US)

(72) Inventor: Alan Weir Bucher, Manheim, PA (US)

(73) Assignee: TE CONNECTIVITY CORPORATION, Berwyn, PA (US)

(*) Notice: Subject to any disclaimer, the term of this patent is extended or adjusted under 35 U.S.C. 154(b) by 0 days.

(21) Appl. No.: 14/972,267

(22) Filed: Dec. 17, 2015

(51) Int. Cl.
*H05K 1/00* (2006.01)
*H01R 12/70* (2011.01)

(52) U.S. Cl.
CPC ................................ *H01R 12/7076* (2013.01)

(58) Field of Classification Search
CPC .................................................. H01R 12/7076
USPC ............................................ 439/290, 78, 79
See application file for complete search history.

(56) References Cited

U.S. PATENT DOCUMENTS 5,556,308 A * 9/1996 Brown .................. H01R 12/58 439/746
5,730,631 A * 3/1998 Tsang .................... H01R 4/184 439/881
6,974,329 B2 * 12/2005 Henneberg ........... H01R 13/112 439/59
7,104,812 B1 * 9/2006 Bogiel ................. H01R 12/724 439/79
7,303,401 B2 * 12/2007 Schell .................. H01R 12/737 439/65
7,425,145 B2 * 9/2008 Ngo ................... H01R 12/7088 439/290
7,452,249 B2 * 11/2008 Daily ................... H01R 13/113 439/825
7,568,917 B1 8/2009 Malstrom et al.
7,690,937 B2 * 4/2010 Daily ................... H01R 13/113 439/290
7,766,664 B2 * 8/2010 Cheng ................ H01R 12/7088 439/65
7,905,731 B2 * 3/2011 Ngo ..................... H01R 12/585 439/75
8,062,046 B2 * 11/2011 Daily ................... H01R 13/113 439/290
8,187,017 B2 * 5/2012 Daily ................... H01R 13/113 439/290
2004/0147177 A1 * 7/2004 Wagner .............. H01R 12/7088 439/855
2006/0003620 A1 * 1/2006 Daily ................... H01R 13/113 439/295

(Continued)

*Primary Examiner* — Tulsidas C Patel
*Assistant Examiner* — Peter G Leigh

(57) ABSTRACT

An electrical power connector includes a power terminal having a first contact and a second contact arranged back-to-back. The first contact has a first thickness. The first contact has a first mating segment having a mating interface. The first contact has a first mounting segment including a first compliant pin. The second contact has a second thickness approximately equal to the first thickness. The second contact has a second mating segment having a mating interface. The second contact has a second mounting segment including a second compliant pin. The first compliant pin is aligned with the second compliant pin and arranged back-to-back such that both the first and second compliant pins are received in a common plated via of a circuit board.

19 Claims, 2 Drawing Sheets

(56) References Cited

U.S. PATENT DOCUMENTS

| | | | | |
|---|---|---|---|---|
| 2006/0128197 | A1 * | 6/2006 | McGowan | H01R 9/091 439/212 |
| 2007/0004291 | A1 * | 1/2007 | Bogiel | H01R 12/724 439/884 |
| 2007/0202748 | A1 * | 8/2007 | Daily | H01R 13/113 439/607.05 |

* cited by examiner

POWER TERMINAL WITH COMPLIANT PIN FOR ELECTRICAL POWER CONNECTOR

BACKGROUND OF THE INVENTION

The subject matter described and/or illustrated herein relates generally to power supplies for supplying electrical power to electrical systems.

Power supplies that supply electrical power to electronic systems are being designed to have greater power capacity (e.g., supply more electrical wattage) to accommodate the increased electrical power consumption of contemporary electronic systems. To accommodate the increased power capacity, the power terminals are manufactured from thick stock material to handle high amperes by lowering resistance and thus maintaining low operating temperatures. In some cases, the material thickness is too large for stamping and forming features, such as compliant pins, via conventional stamping processes. For example, the thick material makes punching difficult because the dies used to create the features are thin and thus susceptible to damage. Some known processes locally thin the material to make punching through the material easier, such as by skiving or coining the material thickness in localized regions. However, skiving adds significant cost and coining alters material properties, such as via cold work of the material.

A need remains for power terminals that are suitable for high power transmission and can be manufactured in a cost effective and reliable manner.

BRIEF DESCRIPTION OF THE INVENTION

In an embodiment, an electrical power connector is provided including a power terminal having a first contact and a second contact arranged back-to-back. The first contact has a first thickness. The first contact has a first mating segment having a mating interface at which the first contact is configured to mate with a first mating contact. The first contact has a first mounting segment including a first compliant pin. The second contact has a second thickness approximately equal to the first thickness. The second contact has a second mating segment having a mating interface at which the second contact is configured to mate with a second mating contact. The second contact has a second mounting segment including a second compliant pin. The first compliant pin is aligned with the second compliant pin and arranged back-to-back such that both the first and second compliant pins are received in a common plated via of a circuit board.

In another embodiment, an electrical power connector is provided including a power terminal having a first contact and a second contact arranged back-to-back. The first contact has a first mating segment having a mating interface at which the first contact is configured to mate with a first mating contact. The first contact has a first mounting segment including a first compliant pin having a first opening having a first width at a widest part of the first opening. The first contact has a first thickness and a width-to-thickness (WIT) stamping ratio of greater than 1.0. The second contact has a second mating segment having a mating interface at which the second contact is configured to mate with a second mating contact. The second contact has a second mounting segment including a second compliant pin having a second opening having a second width at a widest part of the second opening. The second contact has a second thickness and a W/T stamping ratio of greater than 1.0. The first and second compliant pins are aligned back-to-back to form a terminal compliant pin of the power terminal having a terminal compliant pin opening defined by the first and second openings. The terminal compliant pin opening has a third width at a widest part thereof equal to the wider of the first and second openings. The terminal compliant pin has a third thickness and a WIT stamping ratio of less than 1.0.

In a further embodiment, an electrical power connector is provided including a power terminal having a first contact and a second contact. The first and second contacts are mirrored halves arranged back-to-back. The first contact has a first mating segment and a first mounting segment. The first mounting segment includes a first compliant pin having a first tip. The first mounting segment includes a compliant portion including a bulbed section having a first opening therethrough with legs on opposite sides of the first opening. The second contact has a second mating segment and a second mounting segment. The second mounting segment includes a second compliant pin having a second tip. The second mounting segment includes a compliant portion including a bulbed section having a second opening therethrough with legs on opposite sides of the second opening. The first compliant pin is aligned with the second compliant pin such that the first and second openings are aligned to create a common terminal compliant pin opening and the legs are aligned to create common terminal compliant pin legs. Both the first and second compliant pins are received in a common plated via of a circuit board with the legs of both the first and second compliant pins being compressed in the plated via of the circuit board.

DETAILED DESCRIPTION OF THE INVENTION

Figure 1:
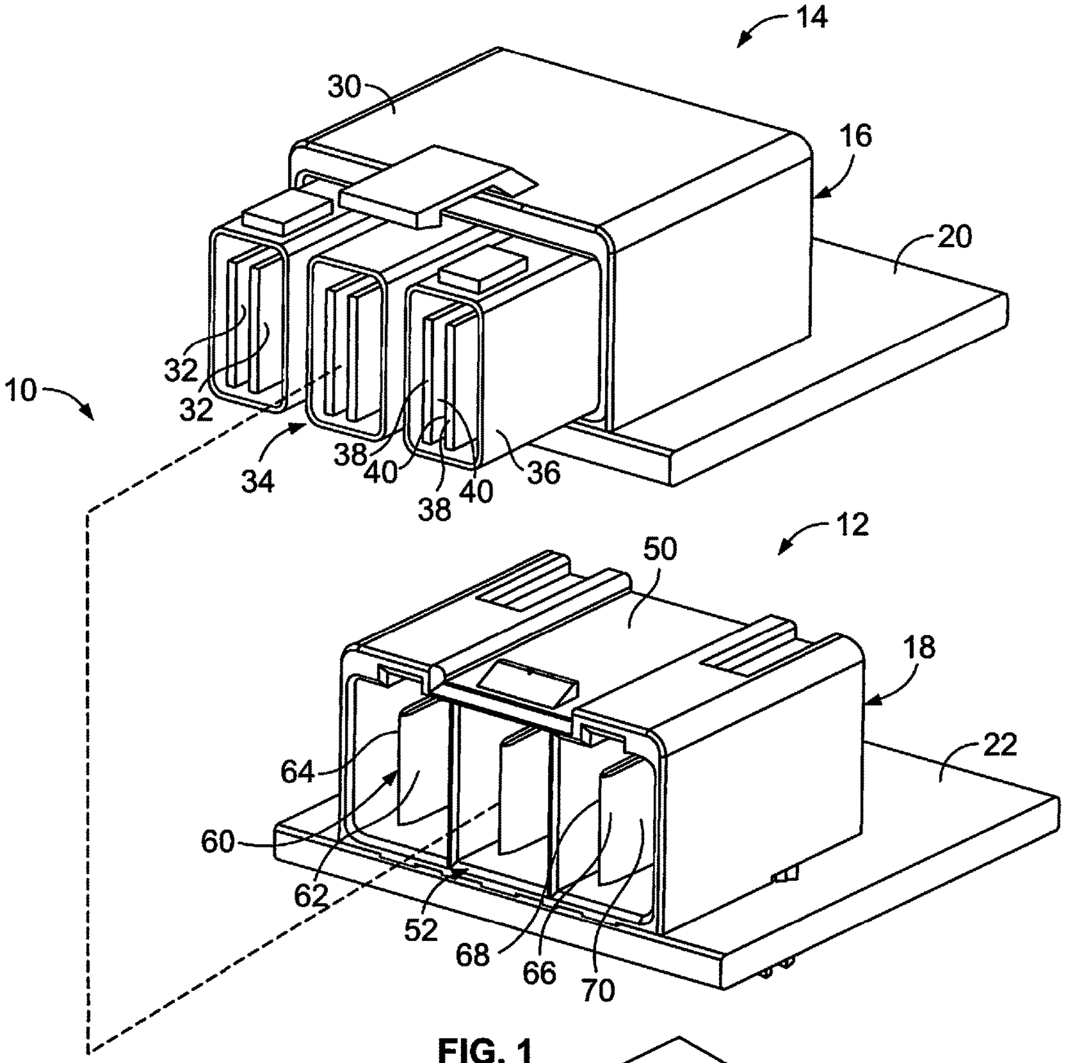
FIG. 1 is a perspective view of an embodiment of an electrical power connector formed in accordance with an exemplary embodiment and poised for mating with an electrical power supply.

FIG. 1 is a perspective view of an embodiment of an assembly 10 of an electronic system 12 and an associated electrical power supply 14. The power supply 14 is configured to be mated with the electronic system 12 to supply the electronic system 12 with electrical power to drive operation of the electronic system 12. FIG. 1 illustrates the electronic system 12 and the power supply 14 in an unmated condition. The power supply 14 includes one or more electrical power connectors 16 that are configured to mate with a corresponding electrical power connector 18 of the electronic system 12 for supplying the electronic system 12 with electrical power. Optionally, the power supply 14 and/or the electronic system 12 may include signal contact(s) for transmitting data signals between the electronic system 12 and the power supply 14 or another component (not shown). Each electrical power connector 16 and each electrical power connector 18 may be referred to herein as a "mating connector" and may include corresponding mating contacts.

The power supply 14 may be any type of electrical power supply having any components, structure, and/or the like. In the illustrated embodiment, the power supply 14 includes a circuit board 20. The power connector 16 of the power supply 14 is coupled to the circuit board 20. In addition or alternative to the circuit board 20, the power supply 14 may include one or more electrical wires or cables (not shown) and/or other components (not shown). For example, the power connector 16 may be cable mounted rather than being board mounted. The power supply 14 may include any number of the power connectors 16 for mating with the electronic system 12. As shown herein, the power supply 14 includes a single power connector 16 and the electronic system 12 includes a single power connector 18. But, the electronic system 12 may include any number of power connectors 18 for mating with any number of power supplies 14.

In the illustrated embodiment, the electronic system 12 includes a circuit board 22, such as a backplane; however the electronic system 12 may include other types of components, such as a power bus bar assembly or other component in alternative embodiments. The electronic system 12 also includes other components that are not shown herein for clarity. Such other components of the electronic system 12 that are not shown herein may include, but are not limited to, processing components, storage components, display components, and/or the like. The electronic system 12 may be any type of electronic system, such as, but not limited to, a line card, a motherboard, a processing unit, and/or the like. Optionally, the electronic system 12 includes one or more signal connectors (not shown), and/or one or more of the power connectors 18 includes signal contact(s) for transmitting signals between the electronic system 12 and another component (not shown).

The electrical power connector 16 includes a housing 30 and one or more electrical power contacts 32 held by the housing 30. The housing 30 includes a mating interface 34 at which the housing 30 mates with the corresponding power connector 18 of the electronic system 12. In the illustrated embodiment, the mating interface 34 includes one or more plugs 36 for mating with the corresponding power connector 18; however, other types of mating interfaces, such as receptacles, may be used in alternative embodiments. The power contacts 32 include mating segments 38 for mating with corresponding electrical power contacts of the power connector 18. The power contacts 32 define mating contacts, and may be referred to hereinafter as mating contacts 32, for mating with the power contacts of the power connector 18.

In the illustrated embodiment, the power contacts 32 are arranged in pairs defining receptacles or sockets for receiving the electrical power contacts of the power connector 18 and for engaging opposite sides of the power contacts of the power connector 18. Optionally, the pairs of power contacts 32 may stem from a common power terminal as a split beam type of power terminal having two or more power contacts; however, other types of power contacts or power terminals may be used in alternative embodiments. The power contacts 32 may be spring beams configured to be elastically deflected when mated with the power contacts of the power connector 18, which causes the power contacts 32 to press against the power contacts of the power connector 18, to ensure a reliable electrical connection is made with the power connector 18. Each mating segment 38 includes a mating interface 40 at which the mating segment 38 mates (i.e., engages in physical contact and thereby electrical connection) with the corresponding power contact of the power connector 18. Although shown as including six power contacts 32, the power connector 16 may include any number of the power contacts 32.

The electrical power connector 18 of the electronic system 12 includes a housing 50 and one or more power terminals 60 which are held by the housing 50. Although shown as including three power terminals 60, the power connector 18 may include any number of the power terminals 60. The power terminals 60 and the housing 50 are mounted to the circuit board 22. The housing 50 includes a mating interface 52 at which the housing 50 mates with the corresponding power connector 16 of the power supply 14. In the illustrated embodiment, the mating interface 52 includes one or more receptacles that receive corresponding plugs 36 of the power connector 16. But, the mating interface 52 of the power connector 18 may additionally or alternatively include any other structure (such as, but not limited to, a plug) for mating with the corresponding power connector 16.

In an exemplary embodiment, each power terminal 60 includes a pair of power contacts, namely first and second power contacts 62, 64, which may be referred to hereinafter as power contacts 62, 64 or simply contacts 62, 64 with or without the first and second identifiers. Additionally, other parts of such contacts 62, 64 may be identified with the designator first and second, respectively. Optionally, the first and second power contacts 62, 64 may be similar and may include similar features. Some features may be described with reference to the first power contact 62 or with reference to the second power contact 64 without corresponding description of such same or similar feature on the other power contact 62, 64.

In an exemplary embodiment, the power contacts 62, 64 are mirrored halves that are arranged back-to-back to form the power terminal 60. However, the power contacts 62, 64 may not be mirrored halves in alternative embodiments. The power contacts 62, 64 may be permanently coupled together, such as by soldering, welding, adhering, fastening, and the like. Alternatively, the power contacts 62, 64 may be non-permanently coupled together, such as being held together by an interference fit, by stiction, or by being pressed together by the housing 50 and/or the circuit board 22.

The power contacts 62, 64 have first and second mating segments 66, 68 for mating with corresponding electrical power contacts 32 of the power connector 16. The mating segments 66, 68 include first and second mating interfaces 70, 72 (72 shown in FIG. 3) at which the mating segments 66, 68 mate (i.e., engages in physical contact and thereby electrical connection) with the corresponding mating segments 38 of the first and second mating contacts 32 of the power connector 16. In the illustrated embodiment, the mating segments 66, 68 are on opposite sides of the power terminal 60 and define multiple points of contact for the power terminal 60 with the corresponding power contacts 32.

Figure 2:
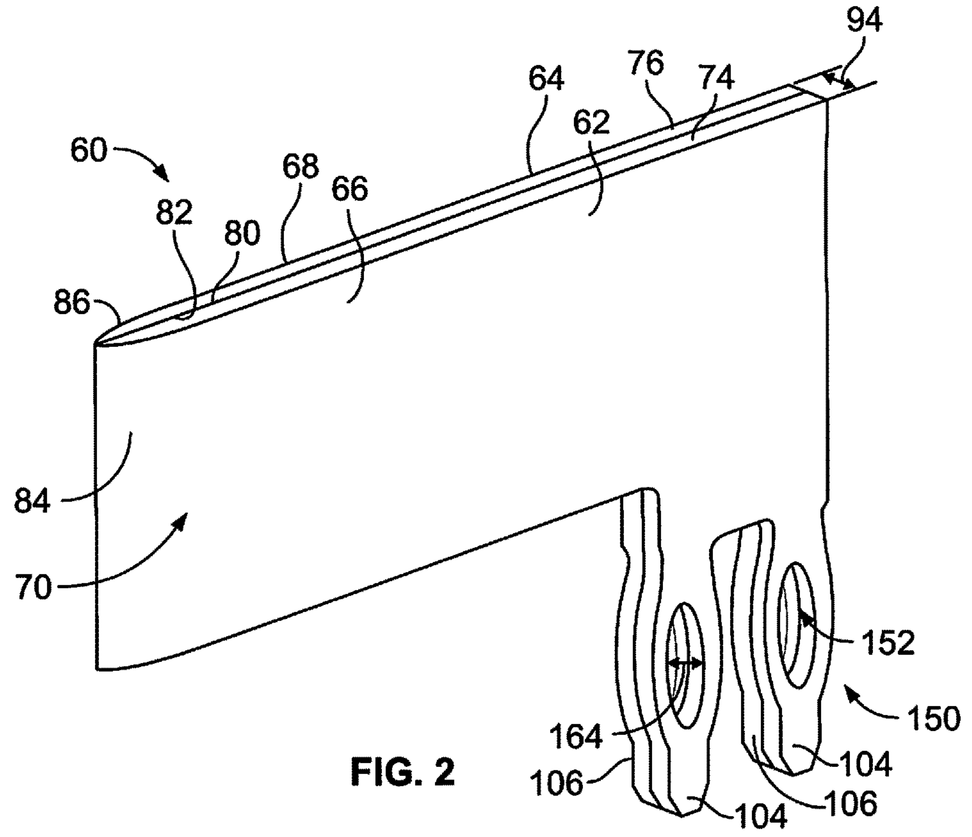
FIG. 2 is a front perspective view of a power terminal of the electrical power connector shown in FIG. 1 and formed in accordance with an exemplary embodiment.
Figure 3:
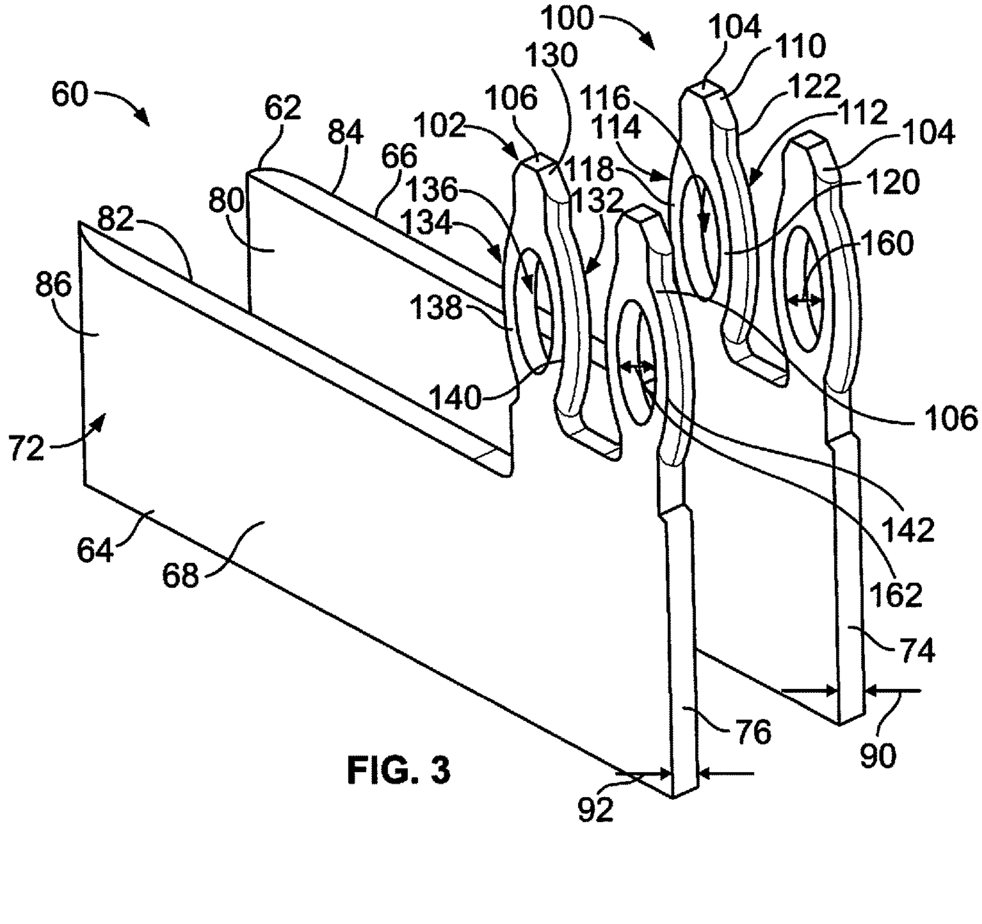
FIG. 3 is a bottom perspective view of the power terminal showing first and second contacts poised for mating together.

FIG. 2 is a front perspective view of the power terminal 60 formed in accordance with an exemplary embodiment. FIG. 3 is a bottom perspective view of the power terminal 60 showing the first and second contacts 62, 64 poised for mating together. The first and second contacts 62, 64 each include a main body 74, 76, respectively. In an exemplary embodiment, the main bodies 74, 76 are generally planar; however, the main bodies 74, 76 may have non-planar sections in alternative embodiments (for example, the contacts may be right angle contacts or have other bends or folds). The first and second contacts 62, 64 are manufactured from metal sheets, such as being stamped and formed, to form the main bodies 74, 76. Optionally, the first and second contacts 62, 64 may be stamped from metal sheets having approximately equal thicknesses.

The mating segments 66, 68 are provided along the main body 74, 76, such as at or near the front of each main body 74, 76. Optionally, the mating segments 66, 68 may be tapered at the front of each main body to reduce stubbing during mating with the power contacts 32 (shown in FIG. 1) of the power connector 16 (shown in FIG. 1). The main bodies 74, 76 are arranged back-to-back such that interior surfaces 80, 82 of the first and second contacts 62, 64 abut against each other, such as along a majority of the main bodies 74, 76. Exterior surfaces 84, 86 of the first and second contacts 62, 64 face in opposite directions. The exterior surfaces 84, 86 define the mating interfaces 70, 72 of the first and second mating segments 66, 68.

The first contact 62 has a first thickness 90 (FIG. 3) defined between the interior surface 80 and the exterior surface 84 thereof. The second contact 64 has a second thickness 92 (FIG. 3) defined between the interior surface 82 and the exterior surface 86 thereof. Optionally, the first and second thicknesses 90, 92 may be approximately equal. The thicknesses 90, 92 are defined by the thicknesses of the sheets of material from which the contacts 62, 64 are stamped. When the contacts 62, 64 are mated together and arranged back-to-back, the power terminal 60 has a third thickness 94 (FIG. 2) being the sum of the first and second thicknesses 90, 92. In alternative embodiments, more than two stamped and formed contacts may be stacked to form the power terminal 60, such as three or more contacts, where the thickness 94 is the sum of all of the thicknesses of all of the contacts. The type of material and the thicknesses 90, 92 of the material of the contacts 62, 64 affect the power transfer capability of the power terminal 60. For example, using both contacts 62, 64 increases the thickness 94 of the power terminal 60, thereby allowing the power terminal 60 to transfer higher current and higher power. Using both contacts 62, 64 lowers the resistance of the power terminal 60 and thereby reduces the operating temperature of the power terminal 60.

Using two contacts 62, 64 to form the power terminal 60 allows each of the contacts 62, 64 to be manufactured separately, which may ease manufacture of the components. For example, because each contact 62, 64 is approximately half the thickness 94, stamping the contacts 62, 64 may be easier. For example, the dies used to stamp the contacts 62, 64 may more easily punch through the thickness 90, 92 of each contact 62, 64 individually, as opposed to punching through the greater thickness 94 of the power terminal 60. The dies are less susceptible to damage and the parts of the contacts 62, 64 are less susceptible to damage because the contacts 62, 64 are thinner than the power terminal 60 having the thickness 94. The dies may be made thinner, which may allow various parts of the contacts 62, 64 to be made smaller or more complex in shape. The parts of the contacts 62, 64 (for example, the compliant pins) may be manufactured more accurately because the dies may more easily punch through the material during stamping.

With specific reference to FIG. 3, the first and second contacts 62, 64 include first and second mounting segments 100, 102 extending from the main bodies 74, 76. The mounting segments 100, 102 may be mounted to the circuit board 22 (shown in FIG. 1). In an exemplary embodiment, the first and second mounting segments 100, 102 include first and second compliant pins 104, 106, respectively. When the power terminal 60 is assembled, the first compliant pin 104 is aligned with the second compliant pin 106 and arranged back-to-back such that both the first and second compliant pins 104, 106 are configured to be received in a common plated via 174 (shown in FIG. 4) of the circuit board 22. In the illustrated embodiment, the first contact 62 includes two compliant pins 104 and the second contact 64 includes two compliant pins 106. The mounting segments 100, 102 may include any number of compliant pins 104, 106. Having multiple compliant pins 104, 106 allows multiple attachment points to the circuit board 22, which may increase the power throughput of the power terminal 60. Having multiple compliant pins 104, 106 increases the surface area of the interface between the power terminal 60 and the circuit board 22 to lower the resistance between the power terminal 60 and the circuit board 22 and increase the current being transferred between the power terminal 60 and the circuit board 22.

Each first compliant pin 104 includes a first tip 110 and a first compliant portion 112. The tip 110 is provided at the distal end of the compliant pin 104. The compliant portion 112 is configured to be loaded into the plated via 174 of the circuit board 22 and is configured to be mechanically and electrically coupled to the circuit board 22. In the illustrated embodiment, the compliant portion 112 is an eye-of-the-needle pin. The compliant portion 112 includes a bulbed section 114 having a first opening 116 therethrough with legs 118, 120 on opposite sides of the first opening 116. The bulbed section 114 is wider than the tip 110. The legs 118, 120 are bowed outward on opposite sides of the opening 116 to form the bulbed section 114. In the illustrated embodiment, the opening 116 is oval-shaped; however, the opening 116 may have other shapes in alternative embodiments. The legs 118, 120 may be flexed inward when the compliant portion 112 is loaded into the plated via 174 of the circuit board 22. The opening 116 provides a space for the legs 118, 120 to flexed inward. The elastic deflection of the legs 118, 120 causes the legs 118, 120 to press outward against the plated via 174 of the circuit board 22 to mechanically and electrically connect the power terminal 60 to the circuit board 22.

Each second compliant pin 106 includes a second tip 130 and a second compliant portion 132. The tip 130 is provided at the distal end of the compliant pin 106. The compliant portion 132 is configured to be loaded into the plated via 174 of the circuit board 22 and is configured to be mechanically and electrically coupled to the circuit board 22. In the illustrated embodiment, the compliant portion 132 is an eye-of-the-needle pin. The compliant portion 132 includes a bulbed section 134 having a second opening 136 therethrough with legs 138, 140 on opposite sides of the second opening 136. The bulbed section 134 is wider than the tip 130. The legs 138, 140 are bowed outward on opposite sides of the opening 136 to form the bulbed section 134. In the illustrated embodiment, the opening 136 is oval-shaped; however, the opening 136 may have other shapes in alternative embodiments.

In an exemplary embodiment, during manufacture of the contacts 62, 64, the compliant pins 104, 106 may be stamped and formed to form rounded exterior edges 122, 142 along the legs 118, 120 and the legs 138, 140, respectively. For example, the compliant pins 104, 106 may be coined to form the curved edges 122, 142. In an exemplary embodiment, the edges 122, 142 are rounded only along the exterior surfaces 84, 86 and not along the interior surfaces 80, 82. Rather, the interior surfaces 80, 82 along the compliant pins 104, 106 are flat in an exemplary embodiment, allowing the compliant pins 104, 106 to be arranged back-to-back in abutting relationship and ensuring maximum surface area for contact between the compliant pins 104, 106 at the interior surfaces 80, 82.

In an exemplary embodiment, with additional reference to FIG. 2, the first and second compliant pins 104, 106 have similar or identical forms allowing the first and second compliant pins 104, 106 to be aligned back-to-back to form one or more terminal compliant pins 150 (FIG. 2) of the power terminal 60. In alternative embodiments, either the first compliant pin 104 or the second compliant pin 106 may be longer than the other such that the compliant pins 104, 106 are vertically offset, such as for sequenced mating with the plated via 174 of the circuit board 22. The openings 116, 136 may be vertically offset. The tips 110, 130 may be vertically offset. The legs 118, 120 and the legs 138, 140 may be vertically offset. Optionally, portions of the compliant pins 104, 106 may be horizontally offset in addition to or alternatively to being vertically offset. The vertical and/or horizontal offset may be within limits that allow the first and second compliant pins 104, 106 to both be inserted into a common plated via 174 of the circuit board 22.

The terminal compliant pins 150 are configured to be loaded into corresponding plated vias 174 of the circuit board 22. The first compliant pin 104 defines approximately half of the terminal compliant pin 150 while the second compliant pin 106 forms approximately half of the terminal compliant pin 150. The terminal compliant pin 150 includes at least one terminal compliant pin opening 152 (FIG. 2). In an exemplary embodiment, the at least one terminal compliant pin opening 152 is defined by the first opening 116 and/or the second opening 136. In the illustrated embodiment, the first and second openings 116, 136 are aligned to form a single, common terminal compliant pin opening 152. However, in embodiments where the first and second openings 116, 136 are vertically offset and not aligned, the terminal compliant pin 150 may include multiple terminal compliant pin openings 152 which may or may not extend entirely through the terminal compliant pin 150.

The first opening 116 has a first width 160 defined at a widest part of the first opening 116 between the legs 118, 120. The first width 160 is measured in a width direction, which is generally perpendicular to the thickness direction and generally perpendicular to a longitudinal direction or a loading direction of the compliant pin 104 into the plated vias 174 of the circuit board 22. Optionally, the widest part of the opening 116 may be approximately centered along the legs 118, 120; however the widest part of the opening 116 may be located closer to the tip 110 or further from the tip 110 along the legs 118, 120 in other various embodiments. The first contact 62 has a width-to-thickness (W/T) stamping ratio of greater than 1.0. The W/T stamping ratio of the first contact 62 is a ratio of the first width 160 to the first thickness 90. Having a W/T stamping ratio of greater than 1.0 means that the width of the first opening 116 is wider than the thickness of the first contact 62. The W/T stamping ratio affects the stamping dies. Having a W/T stamping ratio greater than 1.0 makes stamping easier than a W/T stamping ratio less than 1.0.

The second opening 136 has a second width 162 defined at a widest part of the second opening 136 between the legs 138, 140. Optionally, the widest part of the opening 136 may be approximately centered along the legs 138, 140; however the widest part of the opening 136 may be located closer to the tip 130 or further from the tip 130 along the legs 138, 140 in other various embodiments. The second contact 64 has a W/T stamping ratio, which is a ratio of the second width 162 to the second thickness 92, of greater than 1.0.

The terminal compliant pin opening 152 has a third width 164 defined at a widest part of the terminal compliant pin opening 152. The third width 164 may be defined as the widest part of the first opening 116 or the widest part of the second opening 136, which may be the same in some embodiments. As such, the third width 164 is equal to the wider of the first width 160 or the second width 162. The terminal compliant pin 150 has a W/T stamping ratio, which is a ratio of the third width 164 to the third thickness 94, of less than 1.0. Having a W/T stamping ratio of less than 1.0 means that the thickness 94 of the terminal compliant pin 150 is greater than the width of the terminal compliant pin opening 152. Stamping through a part having a W/T stamping ratio less than 1.0 would be more difficult than stamping through a part having a W/T stamping ratio greater than 1.0.

The lower the W/T stamping ratio, the more difficult it is to manufacture and punch through the thickness of the material to form the features thereof. Hence, having the first and second contacts 62, 64 stamped and formed separately prior to being aligned and brought together to form the power terminal 60 makes manufacturing simpler because both the first contact 62 and the second contact 64 have a higher W/T stamping ratio than would a power terminal having the dimensions of the power terminal 60. The power terminal 60 is not itself stamped, but rather the individual first and second contacts 62, 64 are stamped prior to assembly of the power terminal 60.

In an exemplary embodiment, the W/T stamping ratio of the terminal compliant pin 150 is approximately half of the W/T stamping ratio of the first compliant pin 104. Similarly, the W/T stamping ratio of the terminal compliant pin 150 is approximately half of the W/T stamping ratio of the second compliant pin 106. Thus, individually stamping both the first compliant pin 104 and the second compliant pin 106 is easier than stamping the terminal compliant pin 150 after the first and second contacts 62, 64 are joined to form the power terminal 60. By separating stamping of the terminal compliant pin 150 into two separate stamping operations, namely stamping of the first compliant pin 104 and the stamping of the second compliant pin 106 with the first and second contacts 62, 64, respectively, manufacturing is easier and the stamping dies are less susceptible to damage.

Figure 4:
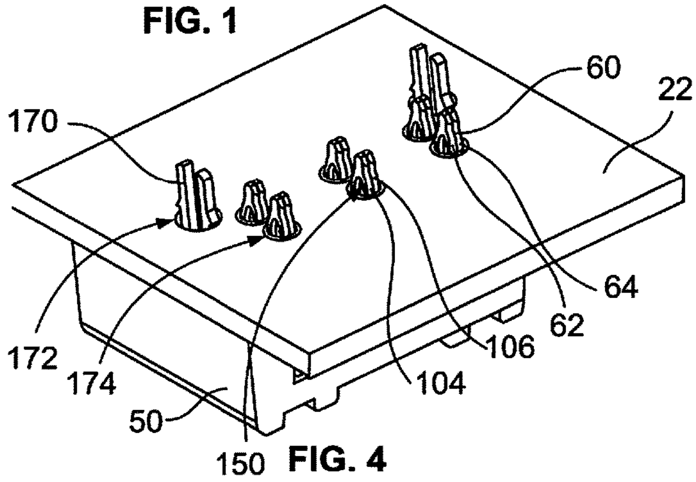
FIG. 4 is a bottom perspective view of the electronic system.

FIG. 4 is a bottom perspective view of the electronic system 12 showing the electrical power connector 18 mounted to the circuit board 22. The housing 50 includes posts 170 extending through openings 172 in the circuit board 22. The posts 170 align the housing 50 to the circuit board 22. The posts 170 may include retention features to retain the housing 50 on the circuit board 22. The posts 170 may be used to locate the terminal compliant pins 150 relative to the plated vias prior to press-fitting of the terminal compliant pins 150 into the plated vias 174.

The power terminals 60 are shown mechanically and electrically connected to the circuit board 22. The terminal compliant pins 150 are received in corresponding plated vias 174 in the circuit board 22. Both compliant pins 104, 106 of the first and second contacts 62, 64 are received in each of the respective plated vias 174. As such, the first contact 62 of each power terminal 60 and the second contact 64 of each power terminal 60 are electrically connected to the circuit board 22 through the corresponding plated via 174.

In an exemplary embodiment, the first and second compliant pins 104, 106 fit tightly in the plated vias 174. As such, the circuit board 22 presses together the first and second compliant pins 104, 106, and thus the first and second contacts 62, 64, to ensure electrical contact between the first and second contacts 62, 64. In an exemplary embodiment, features of the housing 50, such as internal walls or channels, also help to pinch the first and second contacts 62, 64 together to ensure electrical connection between the first and second contacts 62, 64 of the power terminals 60.

The embodiments described and/or illustrated herein provide a power terminal that includes a pair of (optionally mirrored) contacts arranged back-to-back to form the power terminal. Dividing the power terminal into two contact halves reduces the thickness of each part to be stamped, thereby making manufacture easier and making the stamping dies and parts of the contacts less susceptible to damage. For example, by making the stamping ratio larger, the dies are less susceptible to damage or breakage and/or the features can be made smaller.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112(f), unless and until such claim limitations expressly use the phrase "means for" followed by a statement of function void of further structure.

What is claimed is:

1. An electrical power connector comprising:

a power terminal having a first contact and a second contact arranged back-to-back;

the first contact having a first thickness, the first contact having a first mating segment having a mating interface at which the first contact is configured to mate with a first mating contact, the first contact having a first mounting segment comprising a first compliant pin;

the second contact having a second thickness approximately equal to the first thickness, the second contact having a second mating segment having a mating interface at which the second contact is configured to mate with a second mating contact, the second contact having a second mounting segment comprising a second compliant pin;

wherein the first compliant pin is aligned with the second compliant pin and arranged back-to-back such that both the first and second compliant pins are received in a common plated via of a circuit board; and wherein the first compliant pin has a first opening having a first width at a widest part of the first opening, the first contact having a first width-to-thickness (W/T) stamping ratio, the second compliant pin has a second opening having a second width at a widest part of the second opening, the second contact having a second W/T stamping ratio equal to or greater than the first W/T stamping ratio, and the first and second compliant pins are aligned back-to-back to form a terminal compliant pin of the power terminal having at least one terminal compliant pin opening defined by the first and second openings, the terminal compliant pin opening having a third width at a widest part thereof equal to the wider of the first and second openings, the terminal compliant pin having a third thickness equal to a sum of the first and second thicknesses, the terminal compliant pin having a third W/T stamping ratio less than the first and second W/T stamping ratios.

2. The electrical power connector of claim 1, wherein the first compliant pin includes a first opening and the second compliant pin includes a second opening, the first and second openings being aligned to create a common terminal compliant pin opening through the power terminal.

3. The electrical power connector of claim 1, wherein the first contact includes an interior surface and an exterior surface, the second contact includes an interior surface and an exterior surface, the interior surfaces abutting against each other, the exterior surfaces defining the mating interfaces of the first and second mating segments.

4. The electrical power connector of claim 3, wherein the inner surfaces of the first and second compliant pins are flat, the exterior surfaces of the first and second compliant pins are coined and include rounded edges along portions of the first and second compliant pins.

5. The electrical power connector of claim 1, wherein the first compliant pin includes a first tip and a first compliant portion including a bulbed section having a first opening therethrough with legs on opposite sides of the first opening, the second compliant pin includes a second tip and a second compliant portion including a bulbed section having a second opening therethrough with legs on opposite sides of the second opening.

6. The electrical power connector of claim 1, wherein the first width-to-thickness (W/T) stamping ratio is greater than 1.0, wherein the second W/T stamping ratio is greater than 1.0, and wherein the third W/T stamping ratio is less than 1.0.

7. The electrical power connector of claim 1, wherein the third W/T stamping ratio of the terminal compliant pin is approximately half of the first W/T stamping ratio of the first compliant pin.

8. The electrical power connector of claim 7, wherein the third W/T stamping ratio of the terminal compliant pin is approximately half of the second W/T stamping ratio of the second compliant pin.

9. An electrical power connector comprising:

a power terminal having a first contact and a second contact arranged back-to-back;

the first contact having a first mating segment having a mating interface at which the first contact is configured to mate with a first mating contact, the first contact having a first mounting segment comprising a first compliant pin, the first compliant pin having a first opening having a first width at a widest part of the first opening, the first contact having a first thickness, the first contact having a width-to-thickness (W/T) stamping ratio of greater than 1.0;

the second contact having a second mating segment having a mating interface at which the second contact is configured to mate with a second mating contact, the second contact having a second mounting segment comprising a second compliant pin, the second compliant pin having a second opening having a second width at a widest part of the second opening, the second contact having a second thickness, the second contact having a W/T stamping ratio of greater than 1.0;

wherein the first and second compliant pins are aligned back-to-back to form a terminal compliant pin of the power terminal having a terminal compliant pin opening defined by the first and second openings, the terminal compliant pin opening having a third width at a widest part thereof equal to the wider of the first and second openings, the terminal compliant pin having a third thickness, the terminal compliant pin having a W/T stamping ratio of less than 1.0.

10. The electrical power connector of claim 9, wherein the W/T stamping ratio of the first contact is a ratio of the first width to the first thickness, the W/T stamping ratio of the second contact is a ratio the second width to the second thickness, and the W/T stamping ratio of the terminal compliant pin is a ratio of the third width to the third thickness.

11. The electrical power connector of claim 9, wherein the W/T stamping ratio of the terminal compliant pin is approximately half of the W/T stamping ratio of the first compliant pin.

12. The electrical power connector of claim 11, wherein the W/T stamping ratio of the terminal compliant pin is approximately half of the W/T stamping ratio of the second compliant pin.

13. The electrical power connector of claim 9, wherein the first thickness is approximately equal to the second thickness and wherein the first width is approximately equal to the second width.

14. The electrical power connector of claim 9, wherein the first and second contacts are stamped and formed contacts, the first and second contacts being stamped and formed prior to being aligned.

15. The electrical power connector of claim 9, wherein the first contact includes an interior surface and an exterior surface, the second contact includes an interior surface and an exterior surface, the interior surfaces abutting against each other, the exterior surfaces defining the mating interfaces of the first and second mating segments.

16. The electrical power connector of claim 9, wherein the first compliant pin includes a first tip and a first compliant portion including a bulbed section having the first opening therethrough with legs on opposite sides of the first opening, the second compliant pin includes a second tip and a second compliant portion including a bulbed section having the second opening therethrough with legs on opposite sides of the second opening.

17. An electrical power connector comprising:

a power terminal having a first contact and a second contact, the first and second contacts being mirrored halves arranged back-to-back;

the first contact having a first mating segment and a first mounting segment, the first mounting segment comprising a first compliant pin having a first tip and a compliant portion including a bulbed section having a first opening therethrough with legs on opposite sides of the first opening;

the second contact having a second mating segment and a second mounting segment, the second mounting segment comprising a second compliant pin having a second tip and a compliant portion including a bulbed section having a second opening therethrough with legs on opposite sides of the second opening;

wherein the first compliant pin is aligned with the second compliant pin such that the first and second openings are aligned to create a common terminal compliant pin opening and the legs are aligned to create common terminal compliant pin legs, both the first and second compliant pins being received in a common plated via of a circuit board with the legs of both the first and second compliant pins being compressed in the plated via of the circuit board; and wherein the first opening has a first width at a widest part of the first opening, the first contact having a first thickness, the first contact having a width-to-thickness (W/T) stamping ratio of greater than 1.0, wherein the second opening has a second width at a widest part of the second opening, the second contact having a second thickness, the second contact having a W/T stamping ratio of greater than 1.0, and wherein the terminal compliant pin opening has a third width at a widest part thereof equal to the wider of the first and second openings, the terminal compliant pin having a third thickness equal to a sum of the first and second thicknesses, the terminal compliant pin having a W/T stamping ratio of less than 1.0.

18. The electrical power connector of claim 17, wherein the first contact includes an interior surface and an exterior surface, the second contact includes an interior surface and an exterior surface, the interior surfaces being flat and abutting against each other, the exterior surfaces of the first and second compliant pins being coined and include rounded edges along portions of the first and second compliant pins.

19. The electrical power connector of claim 17, wherein the W/T stamping ratio of the terminal compliant pin is approximately half of the W/T stamping ratio of the first compliant pin.

* * * * *